United States Patent
Guo et al.

(10) Patent No.: US 11,908,689 B2
(45) Date of Patent: Feb. 20, 2024

(54) METHOD FOR FABRICATING GAN CHIP AND GAN CHIP

(71) Applicant: INSPUR SUZHOU INTELLIGENT TECHNOLOGY CO., LTD., Jiangsu (CN)

(72) Inventors: Fen Guo, Jiangsu (CN); Kang Su, Jiangsu (CN); Lang Zhou, Jiangsu (CN); Tuo Li, Jiangsu (CN); Hongtao Man, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/268,949

(22) PCT Filed: Oct. 29, 2021

(86) PCT No.: PCT/CN2021/127517
§ 371 (c)(1),
(2) Date: Jun. 21, 2023

(87) PCT Pub. No.: WO2023/284170
PCT Pub. Date: Jan. 19, 2023

(65) Prior Publication Data
US 2023/0395375 A1 Dec. 7, 2023

(30) Foreign Application Priority Data
Jul. 15, 2021 (CN) .......................... 202110798912.8

(51) Int. Cl.
*H01L 21/02* (2006.01)
*H01L 21/683* (2006.01)
(Continued)

(52) U.S. Cl.
CPC ...... *H01L 21/0254* (2013.01); *H01L 21/6835* (2013.01); *H01L 21/7688* (2013.01); *H01L 21/7806* (2013.01)

(58) Field of Classification Search
CPC ............. H01L 21/0254; H01L 21/6835; H01L 21/7688; H01L 21/7806
(Continued)

(56) References Cited

U.S. PATENT DOCUMENTS

| 7,033,961 B1 * | 4/2006 | Smart | H01L 29/66462 |
| | | | 257/E29.253 |
| 8,426,892 B2 * | 4/2013 | Imanishi | H01L 21/02378 |
| | | | 257/E29.081 |

(Continued)

FOREIGN PATENT DOCUMENTS

| CN | 101248221 A | 8/2008 |
| CN | 104409593 A | 3/2015 |

(Continued)

*Primary Examiner* — Vu A Vu
(74) *Attorney, Agent, or Firm* — IPro, PLLC

(57) ABSTRACT

The present application discloses a method, a system, a device, and a storage medium for fabricating a GaN chip. The method includes: growing a $Nb_2N$ sacrificial layer on an original substrate, and growing a GaN insertion layer on the $Nb_2N$ sacrificial layer; growing a $Ta_2N$ sacrificial layer on the GaN insertion layer, and growing a semiconductor layer on the $Ta_2N$ sacrificial layer to form a GaN wafer; bonding the GaN wafer with a first surface of a temporary carrier, and removing the $Nb_2N$ sacrificial layer and the $Ta_2N$ sacrificial layer; and transferring remaining material after removal of the $Nb_2N$ sacrificial layer and the $Ta_2N$ sacrificial layer to a target substrate, and removing the temporary carrier from the remaining material to form the GaN chip.

20 Claims, 2 Drawing Sheets

(51) Int. Cl.
*H01L 21/768* (2006.01)
*H01L 21/78* (2006.01)

(58) Field of Classification Search
USPC .......................................................... 438/670
See application file for complete search history.

(56) References Cited

U.S. PATENT DOCUMENTS

| | | | |
|---|---|---|---|
| 9,656,859 B2* | 5/2017 | Meyer | ................. B81C 1/00539 |
| 9,876,081 B2* | 1/2018 | Meyer | ................. H01L 29/1608 |
| 10,262,856 B2* | 4/2019 | Meyer | ................ H01L 21/02241 |
| 10,340,353 B2* | 7/2019 | Meyer | ................. H01L 21/0495 |
| 10,879,408 B2* | 12/2020 | Jorgenson | ............... H01L 33/06 |
| 2015/0021624 A1 | 1/2015 | Meyer et al. | |
| 2019/0067499 A1 | 2/2019 | Jorgenson | |
| 2021/0043824 A1* | 2/2021 | Yan | ..................... H10N 60/203 |

FOREIGN PATENT DOCUMENTS

| | | |
|---|---|---|
| CN | 110085518 A | 8/2019 |
| CN | 110172732 A | 8/2019 |
| CN | 113270358 A | 8/2021 |

* cited by examiner

METHOD FOR FABRICATING GAN CHIP AND GAN CHIP

This application claims the priority of the Chinese patent application filed on Jul. 15, 2021 before the China National Intellectual Property Administration with the application number of 202110798912.8, and the title of "METHOD FOR FABRICATING GAN CHIP AND GAN CHIP", which is incorporated herein in its entirety by reference.

FIELD

The present application relates to the field of semiconductors, and in particular, to a method, a system, a computer device, and a readable medium for fabricating a GaN chip.

BACKGROUND

In the 21$^{st}$ century, electronic industry and information industry develop rapidly. As an important catalyst of development, semiconductor materials and devices are rapidly propelling mankind into the information technology era. The development of microelectronic devices is closely related to the progress of semiconductor materials. The first generation of semiconductor materials represented by germanium (Ge) and silicon (Si) and the second generation of semiconductor materials represented by gallium arsenide (GaAs) and indium phosphide (InP) have made great contributions to the development of the devices. Gallium nitride (GaN), as a representative of the third generation of semiconductor materials, has been highly favored since its birth and has become the focus of global semiconductor research. The GaN material has the advantages of large band gap, high electron saturation rate, high critical breakdown electric field, strong radiation resistance and other excellent characteristics. Therefore, GaN-based high electron mobility transistors (HEMTs) are widely used in the manufacturing of a new generation of high power and high frequency solid state microwave power devices, which is of great significance to the development of satellite communication, military radar, the 5th Generation Mobile Networks (5G) and other fields.

Theoretically, GaN HEMT devices have excellent power output capacities, but at present, the output power density of conventional GaN-based microwave power devices may only reach ~5 W/mm. The researches show that the actual output capacity of GaN-based microwave power devices is mainly limited by a self-heating effect. At present, GaN heterostructures are generally grown on a sapphire substrate, a silicon carbide (SiC) substrate or a Si substrate, etc. Since SiC has high thermal conductivity, about 10 times that of sapphire, the use of SiC having high thermal conductivity as a substrate or heat sink for high-frequency, high-power GaN-based devices is a good solution to reduce the self-heating effect of the high power GaN-based devices and to solve the problem that power density decreases rapidly as the total power increases and the frequency increases. On the other hand, the lattice mismatch between a SiC substrate and a GaN is relatively small, which may effectively improve the crystal quality of the grown GaN material. However, the price of semi-insulated SiC substrates is very high compared to the other two commonly used GaN material epitaxial substrates, namely sapphire substrates and Si substrates. In order to reduce the cost, an original substrate of a GaN heterostructure on the SiC substrate may be removed by stripping technologies, and then the GaN heterostructure is transferred to other target substrates with relatively low cost and high thermal conductivity. If the stripping process has little effect on the crystal quality of the SiC substrate, the SiC substrate may be reused and the problem of the high cost of the SiC substrate may be solved.

With the stripping technologies, a thin film may be transferred from an original wafer to another wafer. Currently, the mainstream stripping technologies include laser lift-off (LLO), smart-cut, controlled spalling, epitaxial lift-off (ELO), etc. LLO is generally used for stripping GaN films from sapphire substrates. Due to the need for excimer laser in the process, the process is complicated and costly. The smart-cut technology uses ion implantation to generate an ion damage layer below a donor wafer; then, a recipient wafer is combined with the donor wafer; and finally, thin film separation is achieved at the ion damage layer by a stress regulation technology. The most mature application of smart-cut is the preparation of silicon on insulator (SOI) wafers. The success of thin film transfer in smart-cut depends on the bonding quality of the donor wafer and the recipient wafer. Therefore, smart-cut puts forward high requirements for wafer bonding. The controlled spalling technology has successfully achieved the stripping of Si, Ge, GaAs and GaN films from the original substrate by growing a stress-induced layer on the separated thin film which is subjected to tensile stress and then stripping the film from a heterogeneous or homogeneous substrate by pulling tape on the stress-induced layer. However, due to the difficulty of stress regulation, it is difficult to strip large area and high flatness materials and devices by this method.

SUMMARY

In view of this, the embodiments of the present application aim to provide a method, a system, a computer device, and a computer-readable storage medium for fabricating a GaN chip. According to the present application, by introducing sacrificial layers of a "sandwich" structure to be positioned between a GaN functional material and a SiC substrate, a GaN device is stripped from the SiC substrate and transplanted to other substrates with high thermal conductivity to achieve perfect transfer of the GaN device, such that the difficulty of a heterogeneous integration process of the GaN device is reduced, the application range of the GaN device is extended, and the flexibility of heterogeneous integration of the GaN device is improved, which have great significance for improving the performance of radio frequency power devices, improving device thermal management, manufacturing of flexible electronic devices, and other fields.

Based on the objective, one aspect of the embodiments of the present application discloses a method for fabricating a GaN chip, comprising the following steps: growing a $Nb_2N$ sacrificial layer on an original substrate, and growing a GaN insertion layer on the $Nb_2N$ sacrificial layer; growing a $Ta_2N$ sacrificial layer on the GaN insertion layer, and growing a semiconductor layer on the $Ta_2N$ sacrificial layer to form a GaN wafer; bonding the GaN wafer with a first surface of a temporary carrier, and removing the $Nb_2N$ sacrificial layer and the $Ta_2N$ sacrificial layer; and transferring remaining material after removal of the $Nb_2N$ sacrificial layer and the $Ta_2N$ sacrificial layer to a target substrate, and removing the temporary carrier from the remaining material to form the GaN chip.

In some embodiments, growing the $Nb_2N$ sacrificial layer on the original substrate comprises:
fabricating a $Nb_2N$ sacrificial layer with a thickness of 0-50 nm on the original substrate.

In some embodiments, growing the Ta$_2$N sacrificial layer on the GaN insertion layer comprises:
  fabricating a Ta$_2$N sacrificial layer with a thickness of 0-50 nm on the GaN insertion layer.

In some embodiments, bonding the GaN wafer with the first surface of the temporary carrier comprises:
  coating the first surface of the temporary carrier with an adhesive material, placing the temporary carrier on a hot plate for baking, and then cooling the temporary carrier.

In some embodiments, coating the first surface of the temporary carrier with the adhesive material comprises:
  coating the first surface of the temporary carrier with the adhesive material by a spin coating method, and controlling a rotation speed to be 1200-3000 rpm and time to be 30-60 seconds.

In some embodiments, placing the temporary carrier on the hot plate for baking comprises:
  controlling the temperature of the hot plate to 120° C. and baking for 3 minutes; and
  controlling the temperature of the hot plate to 180° C. and baking for 4 minutes.

In some embodiments, bonding the GaN wafer with the first surface of the temporary carrier comprises:
  controlling the bonding temperature to 200-350° C. and the bonding pressure to 1000-2000 N.

In some embodiments, removing the Nb$_2$N sacrificial layer and the Ta$_2$N sacrificial layer comprises:
  removing the Nb$_2$N sacrificial layer and the Ta$_2$N sacrificial layer by etching with hydrochloric acid and hydrofluoric acid at a volume ratio of 1:1.

In some embodiments, transferring the remaining material after removal of the Nb$_2$N sacrificial layer and the Ta$_2$N sacrificial layer to the target substrate comprises:
  activating the remaining material and the target substrate with nitrogen or oxygen, aligning the activated target substrate with the activated remaining material for attachment, and carrying out annealing.

According to another aspect, there is provided a chip, fabricated by the method above.

The present application has the following beneficial technical effects: by introducing the sacrificial layers of a "sandwich" structure to be positioned between the GaN functional material and the SiC substrate, the GaN device is stripped from the SiC substrate and transplanted to other substrates with high thermal conductivity to achieve perfect transfer of the GaN device, such that the difficulty of a heterogeneous integration process of the GaN device is reduced, the application range of the GaN device is extended, and the flexibility of heterogeneous integration of the GaN device is improved, which have great significance for improving the performance of radio frequency power devices, improving device thermal management, manufacturing of flexible electronic devices, and other fields.

BRIEF DESCRIPTION OF THE DRAWINGS

In order to more clearly describe the technical solutions of the embodiments of the present application or in the prior art, drawings that are to be referred for description of the embodiments or the prior art will be briefly described hereinafter. Apparently, the drawings described hereinafter merely illustrate some embodiments of the present application, and a person of ordinary skill in the art may also derive other embodiments based on the drawings described herein without any creative effort.

DETAILED DESCRIPTION

In order to make the objects, technical solutions, and advantages of the present application clearer, embodiments of the present application are further described in detail below with reference to specific embodiments and the accompanying drawings.

It is to be noted that all expressions using "first" and "second" in the embodiments of the present application are intended to distinguish two different entities or parameters with the same name. It may be seen that "first" and "second" are merely for the convenience of expressions and should not be construed as limiting the embodiments of the present application, which will not be stated one by one in subsequent embodiments.

Figure 1:
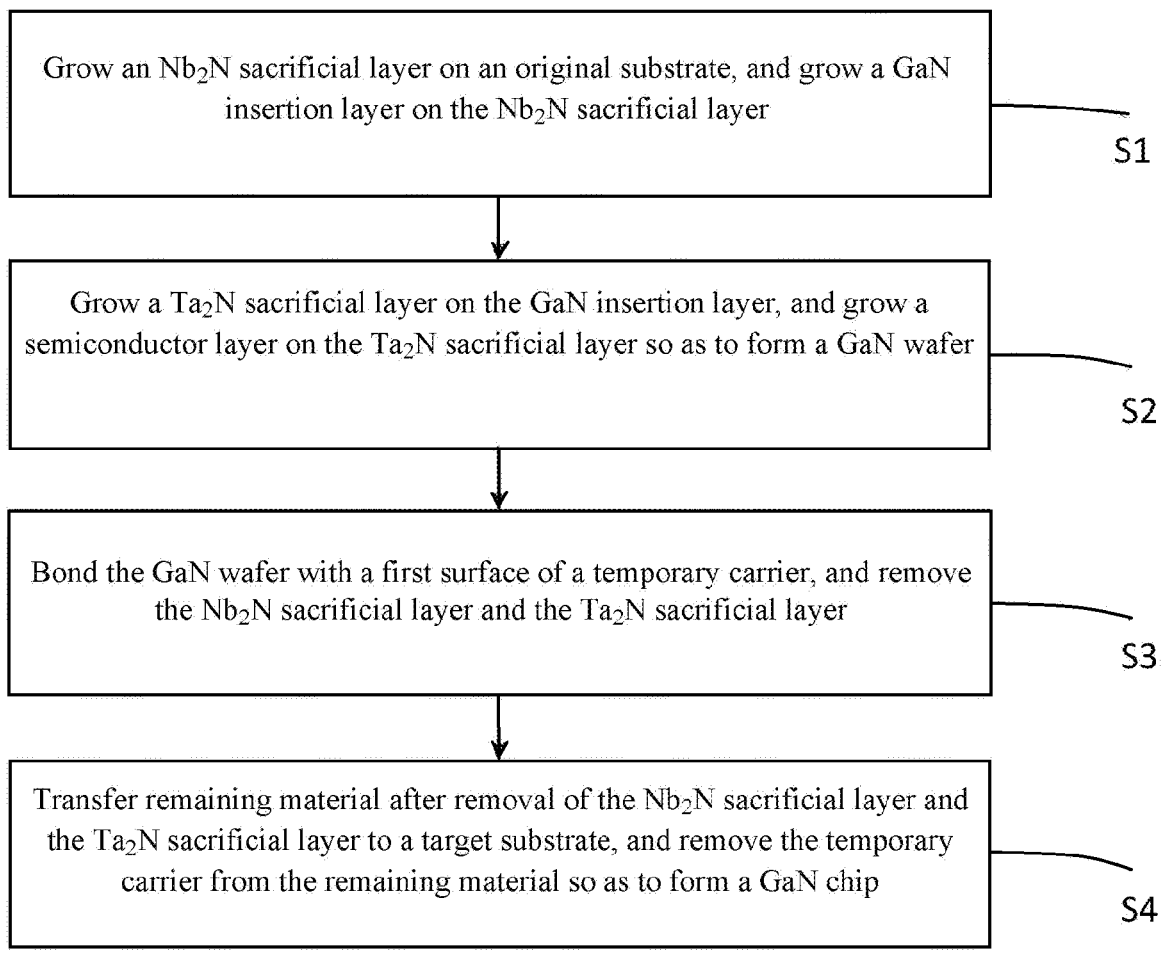
FIG. 1 is a schematic diagram of a method for fabricating a GaN chip according to an embodiment of the present application.

In the first aspect of the embodiments of the present application, an embodiment of a method for fabricating a GaN chip is provided. FIG. 1 illustrates a schematic diagram of a method for fabricating a GaN chip according to an embodiment of the present application. As shown in FIG. 1, the embodiment of the present application includes the following steps:

S1: growing a Nb$_2$N sacrificial layer on an original substrate, and growing a GaN insertion layer on the Nb$_2$N sacrificial layer.

S2: growing a Ta$_2$N sacrificial layer on the GaN insertion layer, and growing a semiconductor layer on the Ta$_2$N sacrificial layer to form a GaN wafer.

S3: bonding the GaN wafer with a first surface of a temporary carrier, and removing the Nb$_2$N sacrificial layer and the Ta$_2$N sacrificial layer.

S4: transferring remaining material after removal of the Nb$_2$N sacrificial layer and the Ta$_2$N sacrificial layer to a target substrate, and removing the temporary carrier from the remaining material to form the GaN chip.

According to the embodiment of the present application, by introducing the sacrificial layers of an Nb$_2$N/GaN/Ta$_2$N sandwich structure to be positioned between a GaN functional material and a SiC substrate, a GaN device is stripped from the SiC substrate and transplanted to other substrates with high thermal conductivity to achieve perfect transfer of the GaN device, such that the difficulty of a heterogeneous integration process of the GaN device is reduced, the application range of the GaN device is extended, and the flexibility of heterogeneous integration of the GaN device is improved, which have great significance for improving performance of radio frequency power devices, improving device thermal management, manufacturing of flexible electronic devices, and other fields.

The Nb$_2$N sacrificial layer is grown on the original substrate, and the GaN insertion layer is grown on the Nb$_2$N sacrificial layer. In some embodiments, growing the Nb$_2$N sacrificial layer on the original substrate includes: fabricate a Nb$_2$N sacrificial layer with a thickness of 0-50 nm on the original substrate. In the embodiment of the present application, a silicon carbide (SiC) material with hexagonal crystal structure symmetry is selected as the original substrate. Of course, the original substrate is not limited to SiC, but may also be GaN, sapphire, diamond, gallium trioxide ($Ga_2O_3$), aluminum nitride (AlN), etc. The sacrificial layers of the sandwich structure are grown by thin film deposition. By regulating the growth process and controlling the growth temperature and the dose ratio of Nb atoms to N atoms, the $Nb_2N$ sacrificial layer with a β phase is grown on the substrate, and the growth thickness of the $Nb_2N$ sacrificial layer is 0-50 nm. The GaN insertion layer is grown on the $Nb_2N$ sacrificial layer, and the thickness of the GaN insertion layer is 0-200 nm.

The $Ta_2N$ sacrificial layer is grown on the GaN insertion layer, and the semiconductor layer is grown on the $Ta_2N$ sacrificial layer to form the GaN wafer. In some embodiments, growing the $Ta_2N$ sacrificial layer on the GaN insertion layer includes: fabricating a $Ta_2N$ sacrificial layer with a thickness of 0-50 nm on the GaN insertion layer. The $Ta_2N$ sacrificial layer with hexagonal crystal structure symmetry is grown on the GaN insertion layer by thin film deposition, and the growth thickness of the $Ta_2N$ sacrificial layer is 0-50 nm. The semiconductor layer is grown on the $Ta_2N$ sacrificial layer.

The GaN wafer is bonded with the first surface of the temporary carrier, and the $Nb_2N$ sacrificial layer and the $Ta_2N$ sacrificial layer are removed.

In some embodiments, bonding the GaN wafer with the first surface of the temporary carrier includes: coat the first surface of the temporary carrier with an adhesive material, place the temporary carrier on a hot plate for baking, and then cool the temporary carrier, for example, wait for the temporary carrier to be cooled at room temperature. A front surface of the temporary carrier is coated with the temporary adhesive material as a bonding material. The temporary carrier is placed on the hot plate for baking with the front surface up. After the temporary carrier is naturally cooled at the room temperature, the SiC-based GaN wafer is bonded with the front surface of the temporary carrier in a face-to-face manner.

In some embodiments, coating the first surface of the temporary carrier with the adhesive material includes: coating the first surface of the temporary carrier with the adhesive material by a spin coating method, and controlling a rotation speed to be 1200-3000 rpm and time to be 30-60 seconds. The temporary bonding material is applied by the spin coating method, with the rotation speed being 1200 rpm-3000 rpm and the time being 30-60 s.

In some embodiments, placing the temporary carrier on the hot plate for baking includes: controlling the temperature of the hot plate to 120° C. and baking for 3 minutes; and controlling the temperature of the hot plate to 180° C. and baking for 4 minutes. The two-step baking method is adopted, that is, in the first step, the baking time is 3 min and the temperature of the hot plate is 120° C.; and in the second step, the baking time is 4 min and the temperature of the hot plate is 180° C.

In some embodiments, bonding the GaN wafer with the first surface of the temporary carrier includes: controlling the bonding temperature to 200-350° C. and the bonding pressure to 1000-2000 N. After the temporary carrier is naturally cooled at the room temperature, the SiC-based GaN wafer is bonded with the front surface of the temporary carrier in a face-to-face manner, with the bonding temperature being 200-350° C. and the bonding pressure being 1000-2000 N.

In some embodiments, bonding the GaN wafer with the first surface of the temporary carrier includes: after the temporary carrier is naturally cooled at the room temperature, the SiC-based GaN wafer faces the front surface of the temporary carrier, and then the SiC-based GaN wafer and the carrier overlap as complete as possible and are fixed with a clamp and placed into a bonding machine for bonding. Wafer bonding is carried out through the wafer bonding machine, the bonding temperature is 150-200° C., the bonding time is 5-10 min, and the pressure is 0.1 MPa.

In some embodiments, removing the $Nb_2N$ sacrificial layer and the $Ta_2N$ sacrificial layer includes: remove the $Nb_2N$ sacrificial layer and the $Ta_2N$ sacrificial layer by etching with hydrochloric acid and hydrofluoric acid at a volume ratio of 1:1. The sacrificial layers of the $Nb_2N$/GaN/$Ta_2N$ sandwich structure are removed by selective wet chemical etching with hydrochloric acid and hydrofluoric acid at a volume ratio of 1:1, and after etching is completed, the SiC substrate is separated from the GaN material.

In some embodiments, removing the $Nb_2N$ sacrificial layer and the $Ta_2N$ sacrificial layer includes: remove the $Nb_2N$/$Ta_2N$ stacked sacrificial layers with nitric acid, reactive non-plasma gas $XeF_2$. Growing the sacrificial layers of the $Nb_2N$/GaN/$Ta_2N$ sandwich structure on the original substrate includes, but is not limited to, metal organic chemical vapor deposition, molecular beam epitaxy, sputtering, atomic layer deposition, and pulsed laser deposition. It is better to grow III-V epitaxial materials in situ directly after the deposition of the $Nb_2N$ sacrificial layer to avoid contamination. The semiconductor layer may be a GaN HEMT structure, a GaN MOSFET structure, a GaN Finfet structure, etc.

The remaining material after removal of the $Nb_2N$ sacrificial layer and the $Ta_2N$ sacrificial layer is transferred to the target substrate, and the temporary carrier is removed from the remaining material to form the GaN chip.

In some embodiments, transferring the remaining material after removal of the $Nb_2N$ sacrificial layer and the $Ta_2N$ sacrificial layer to the target substrate includes: activating the remaining material and the target substrate with nitrogen or oxygen, aligning the activated target substrate with the activated remaining material for attachment, and carrying out annealing. The GaN material is transferred to the target substrate by direct bonding. Direct bonding refers to plasma activation of the target substrate and a back surface of the GaN material with gas, where the gas is N2 or $O_2$, the gas flow is 50-200 sccm, and the activation time is 10-60 s. After being activated, the target substrate and the GaN material are aligned and attached, and annealing is carried out at a temperature of 150-200° C. for 2 h. The GaN wafer is immersed in a remover for the temporary bonding material, and the GaN wafer may be automatically separated from the temporary carrier after the temporary bonding material is completely dissolved by the remover.

The present application provides a technology for improving heat dissipation of the GaN chip to grow a semiconductor epitaxial material structure, and the structure adopts the sacrificial layers of the $Nb_2N$/GaN/$Ta_2N$ sandwich structure due to the similar lattice matching of $Nb_2N$ and $Ta_2N$ with GaN. The GaN insertion layer in the sandwich structure is mainly used for alleviating lattice mismatch between the SiC substrate and a GaN buffer layer above, so the use of the sacrificial layers of the $Nb_2N$/GaN/$Ta_2N$ sandwich structure may improve the crystal quality of an epitaxial GaN material. A $Ta_2N$ ultrathin film has high surface coverage and good uniformity, such that the surface roughness of the back surface of the stripped GaN material may be lower, and the back surface of the stripped GaN material does not require additional polishing treatment and is easy to transfer to the target substrate. It is easier for the sacrificial layers of the Nb$_2$N/GaN/Ta$_2$N sandwich structure to be wet-etched and stripped, and the SiC substrate may be reused with a simple surface treatment. The growth temperature of the sacrificial layers of the Nb$_2$N/GaN/Ta$_2$N sandwich structure is compatible with that of III-N. The sacrificial layers of the Nb$_2$N/GaN/Ta$_2$N sandwich structure have selective etching properties on SiC, and the sacrificial lay ers of the Nb$_2$N/GaN/Ta$_2$N sandwich structure are removed by selective wet chemical etching with hydrochloric acid and hydrofluoric acid at a volume ratio of 1:1 or by reactive non-plasma gas XeF$_2$. Moreover, GaN, AlN, and most common metals and dielectric may not be etched in the process. The GaN material is then transferred to the target substrate, such that the reuse of the SiC substrate is achieved, and the heat dissipation efficiency of the GaN chip is improved.

Nb$_2$N and Ta$_2$N have similar crystal structures with SiC, GaN and AlN, and a Nb$_2$N film and a Ta$_2$N film may grow on SiC. The sacrificial layers of the Nb$_2$N/GaN/Ta$_2$N sandwich structure may be heterotically integrated with a 111-N device without affecting the material quality and electrical properties of a subsequent 111-N layer. The research work confirms that AlN and GaN heterostructures with high crystallinity and electrical quality may be grown on a Nb$_2$N/GaN thin layer, which is almost identical to growing directly on a GaN film. According to the present application, by introducing the sacrificial layers of the Nb$_2$N/GaN/Ta$_2$N sandwich structure, the transfer of the III-N device mar be completed by using a simple treating process after previous processing and quality screening are completed, and by embedding the thin sacrificial layers of the Nb$_2$N/GaN/Ta$_2$N sandwich structure, a fabricated III-N device may be completely separated from a substrate thereof.

In particular, it should be pointed out that the steps in each embodiment of the method for fabricating the GaN chip may be crossed, replaced, added, and deleted. Thus, these reasonable combinations of the method for fabricating the GaN chip shall also fall within the protection scope of the present application, and the protection scope of the present application shall not be limited to the embodiments.

For the above purpose, in the second aspect of the embodiments of the present application, a chip fabricated by using any one of the above methods is provided. For the sake of brevity, the above methods will not be repeated here.

For the above purpose, in the third aspect of the embodiments of the present application, a system for fabricating a GaN chip is provided. The system includes: a first sacrificial module, configured to grow a Nb$_2$N sacrificial layer on an original substrate, and grow a GaN insertion layer on the Nb$_2$N sacrificial layer; a second sacrificial module, configured to grow a Ta$_2$N sacrificial layer on the GaN insertion layer, and grow a semiconductor layer on the Ta$_2$N sacrificial layer to form a GaN wafer; a removing module, configured to bond the GaN wafer with a first surface of a temporary carrier, and remove the Nb$_2$N sacrificial layer and the Ta$_2$N sacrificial layer; and an execution module, configured to transfer remaining material after removal of the Nb$_2$N sacrificial laver and the Ta$_2$N sacrificial layer to a target substrate, and remove the temporary carrier from the remaining material to form the GaN chip.

In some embodiments, the removing module is configured to: coat the first surface of the temporary carrier with an adhesive material, place the temporary carrier on a hot plate for baking, and then cool the temporary carrier.

In some embodiments, the removing module is configured to: coat the first surface of the temporary carrier with the adhesive material by a spin coating method, and control a rotation speed to be 1200-3000 rpm and time to be 30-60 seconds.

In some embodiments, the removing module is configured to: control the temperature of the hot plate to 120° C. and bake for 3 minutes; and control the temperature of the hot plate to 180° C. and bake for 4 minutes.

In some embodiments, the removing module is configured to: control the bonding temperature to 200-350° C. and the bonding pressure to 1000-2000 N.

In some embodiments, the removing module is configured to: remove the Nb$_2$N sacrificial layer and the Ta$_2$N sacrificial layer by etching with hydrochloric acid and hydrofluoric acid at a volume ratio of 1:1.

In some embodiments, the execution module is configured to: activate the remaining material and the target substrate with nitrogen or oxygen, align the activated target substrate with the activated remaining material for attachment, and carry out annealing.

For the above purpose, in the fourth aspect of the embodiments of the present application, a computer device is provided. The computer device includes: at least one processor; and a memory having computer instructions capable of running on the processor stored thereon. The instructions are executed by the processor to implement the following steps: S1. Grow a Nb N sacrificial layer on an original substrate, and grow a GaN insertion layer on the Nb$_2$N sacrificial layer. S2. Grow a Ta$_2$N sacrificial layer on the GaN insertion layer, and grow a semiconductor layer on the Ta$_2$N sacrificial layer to form a GaN wafer. S3. Bond the GaN wafer with a first surface of a temporary carrier, and remove the Nb$_2$N sacrificial layer and the Ta$_2$N sacrificial layer. S4. Transfer remaining material after removal of the Nb$_2$N sacrificial layer and the Ta$_2$N sacrificial layer to a target substrate, and remove the temporary carrier from the remaining material to form the GaN chip.

In some embodiments, bonding the GaN wafer with the first surface of the temporary carrier includes: coat the first surface of the temporary carrier with an adhesive material, place the temporary carrier on a hot plate for baking, and then cool the temporary carrier.

In some embodiments, coating the first surface of the temporary carrier with the adhesive material includes: coat the first surface of the temporary carrier with the adhesive material by a spin coating method, and control a rotation speed to be 1200-3000 rpm and time to be 30-60 seconds.

In some embodiments, placing the temporary carrier on the hot plate for baking includes: control the temperature of the hot plate to 120° C. and bake for 3 minutes; and control the temperature of the hot plate to 180° C. and bake for 4 minutes.

In some embodiments, bonding the GaN wafer with the first surface of the temporary carrier includes: control the bonding temperature to 200-350° C. and the bonding pressure to 1000-2000 N.

In some embodiments, removing the Nb$_2$N sacrificial layer and the Ta$_2$N sacrificial layer includes: remove the Nb$_2$N sacrificial layer and the Ta$_2$N sacrificial layer by etching with hydrochloric acid and hydrofluoric acid at a volume ratio of 1:1.

In some embodiments, transferring the remaining material after removal of the N b$_2$N sacrificial layer and the Ta$_2$N sacrificial layer to the target substrate includes: activate the remaining material and the target substrate with nitrogen or oxygen, align the activated target substrate with the activated remaining material for attachment, and carry out annealing.

Figure 2:
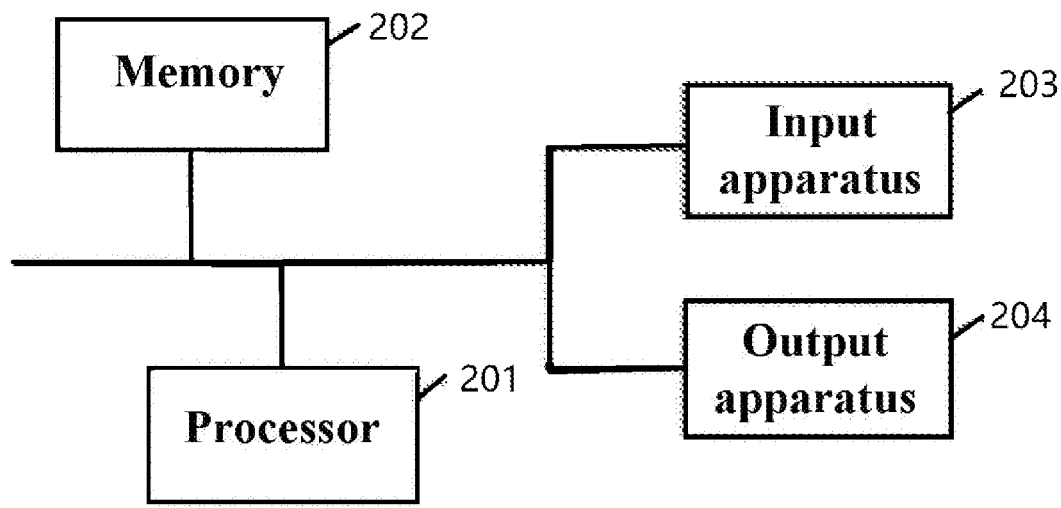
FIG. 2 is a schematic diagram of a hardware structure of a computer device for fabricating a GaN chip according to an embodiment of the present application.

FIG. 2 is a schematic diagram of a hardware structure of the above-mentioned computer device for fabricating the GaN chip according to an embodiment of the present application.

Taking an apparatus shown in FIG. 2 as an example, the apparatus includes a processor 201 and a memory 202, and may further include an input apparatus 203 and an output apparatus 204.

The processor 201, the memory 202, the input apparatus 203, and the output apparatus 204 may be connected via a bus or other means. FIG. 2 shows an example of a connection via a bus.

The memory 202 serves as a non-volatile computer-readable storage medium that may be configured to store non-volatile software programs, non-volatile computer executable programs, and modules, such as program instructions/modules corresponding to the method for fabricating the GaN chip according to the embodiment of the present application. The processor 201 executes various functional applications of a server as well as data processing by running the non-volatile software programs, instructions, and modules stored in the memory 202, i.e., to implement the method for fabricating the GaN chip according to the above method embodiment.

The memory 202 may include a program storage region and a data storage region. The program storage region may store applications required for an operating system and at least one function. The data storage region may store data created according to the use of the method for fabricating the GaN chip. In addition, the memory 202 may include a high-speed random access memory, and may also include a non-volatile memory, such as at least one disk storage device, a flash memory device, or other non-volatile solid-state storage devices. In some embodiments, the memory 202 optionally includes memories that are remotely set up relative to the processor 201, and these remote memories may be connected to local modules via networks. Examples of such networks include, but are not limited to, the Internet, intranets, local area networks, mobile communication networks, and combinations thereof.

The input apparatus 203 may receive input user names, passwords and other information. The output apparatus 204 may include display devices such as display screens.

One or more program instructions/modules corresponding to the method for fabricating the GaN chip are stored in the memory 202 and, when executed by the processor 201, execute the method for fabricating the GaN chip according to any of the above method embodiments.

Any of the embodiments of the computer device that executes the above-mentioned method for fabricating the GaN chip may achieve the same or similar effects as any of the above method embodiments corresponding thereto.

The present application further provides a computer-readable storage medium. The computer-readable storage medium stores a computer program that performs the above method when executed by a processor.

Figure 3:
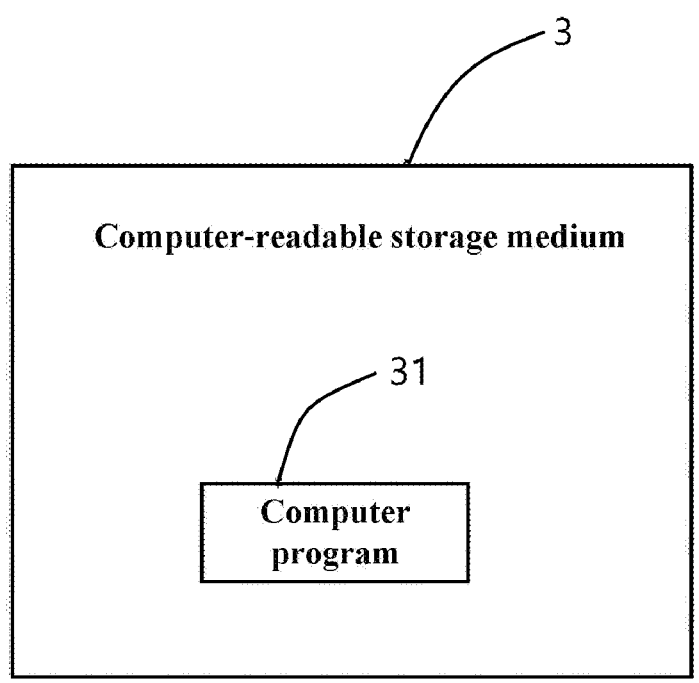
FIG. 3 is a schematic diagram of a computer storage medium for fabricating a GaN chip according to an embodiment of the present application.

FIG. 3 is a schematic diagram of the above-mentioned computer storage medium for fabricating the GaN chip according to an embodiment of the present application. Taking the computer storage medium shown in FIG. 3 as an example, the computer-readable storage medium 3 stores a computer program 31 that executes the method for fabricating the GaN chip when executed by the processor.

The method for fabricating the GaN chip includes the following steps: grow a $Nb_2N$ sacrificial layer on an original substrate, and grow a GaN insertion layer on the $Nb_2N$ sacrificial layer; grow a $Ta_2N$ sacrificial layer on the GaN insertion layer, and grow a semiconductor layer on the $Ta_2N$ sacrificial layer to form a GaN wafer: bond the GaN wafer with a first surface of a temporary carrier, and remove the $Nb_2N$ sacrificial layer and the $Ta_2N$ sacrificial layer; and transfer remaining material after removal of the $Nb_2N$ sacrificial layer and the $Ta_2N$ sacrificial layer to a target substrate, and remove the temporary carrier from the remaining material to form the GaN chip.

In some embodiments, growing the $Nb_2N$ sacrificial layer on the original substrate includes: fabricate a $Nb_2N$ sacrificial layer with a thickness of 0-50 nm on the original substrate.

In some embodiments, growing the $Ta_2N$ sacrificial layer on the GaN insertion layer includes: fabricating a $Ta_2N$ sacrificial layer with a thickness of 0-50 nm on the GaN insertion layer.

In some embodiments, bonding the GaN wafer with the first surface of the temporary carrier includes: coat the first surface of the temporary carrier with an adhesive material, place the temporary carrier on a hot plate for baking, and then cool the temporary carrier.

In some embodiments, coating the first surface of the temporary carrier with the adhesive material includes: coat the first surface of the temporary carrier with the adhesive material by a spin coating method, and control a rotation speed to be 1200-3000 rpm and time to be 30-60 seconds.

In some embodiments, placing the temporary carrier on the hot plate for baking includes: control the temperature of the hot plate to 120° C. and bake for 3 minutes; and control the temperature of the hot plate to 180° C. and bake for 4 minutes.

In some embodiments, bonding the GaN wafer with the first surface of the temporary carrier includes: control the bonding temperature to 200-350° C. and the bonding pressure to 1000-2000 N.

In some embodiments, removing the $Nb_2N$ sacrificial layer and the $Ta_2N$ sacrificial layer includes: remove the $Nb_2N$ sacrificial layer and the $Ta_2N$ sacrificial layer by etching with hydrochloric acid and hydrofluoric acid at a volume ratio of 1:1.

In some embodiments, transferring the remaining material after removal of the $Nb_2N$ sacrificial layer and the $Ta_2N$ sacrificial layer to the target substrate includes: activate the remaining material and the target substrate with nitrogen or oxygen, align the activated target substrate with the activated remaining material for attachment, and carry out annealing.

Finally, it should be noted that a person of ordinary skill in the art may understand that implementation of all or part of the processes in the method of the above embodiments may be completed by means of a computer program that instructs relevant hardware. Programs of the method for fabricating the GaN chip may be stored in a computer-readable storage medium, and the programs, when executed, may include the processes of the above method embodiments. A program storage medium may be a magnetic disk, a compact disk, a read-only memory (ROM), or a random access memory (RAM), etc. The embodiments of the computer program may achieve the same or similar effects as any of the above method embodiments corresponding thereto.

The above are exemplary embodiments of the present application, but it should be noted that various changes and modifications may be made without deviating from the scope of disclosure of the embodiments of the present application as defined by the appended claims. The functions, steps, and/or actions of the method claims in accordance with the disclosed embodiments described herein need not be performed in any particular order. Furthermore, although elements according to the embodiments of the present application may be described or claimed in the singular, the plural is contemplated unless limitation to the singular is explicitly stated.

It should be understood that, as used herein, the singular forms "a", "an", and "the" are intended to include the plural forms as well, unless the context clearly supports the exception. It should also be understood that the term "and/or" as used herein refers to any or all possible combinations including one or more associated listed items.

The serial number of the embodiments of the present application is disclosed for description merely and does not represent the merits of the embodiments.

A person of ordinary skill in the art may appreciate that all or part of the steps of implementing the above embodiments may be completed by hardware, or may be completed by instructing relevant hardware through a program. The program may be stored in a computer-readable storage medium which may be a read-only memory, a magnetic disk or a compact disk, etc.

A person of ordinary skill in the art may appreciate that the above discussion of any embodiments is intended to be exemplary only, and is not intended to suggest that the scope (including the claims) of the embodiments of the present application is limited to these examples; and combinations of features in the above embodiments or in different embodiments are also possible within the framework of the embodiments of the present application, and many other variations of different aspects of the embodiments of the present application as described above are possible, which are not provided in detail for the sake of clarity. Therefore, any omission, modification, equivalent substitution, improvement, etc. made within the spirit and principles of the embodiments of the present application shall fall within the protection scope of the embodiments of the present application.

The invention claimed is:

1. A method for fabricating a GaN chip, comprising:
    growing a $Nb_2N$ sacrificial layer on an original substrate, and growing a GaN insertion layer on the $Nb_2N$ sacrificial layer;
    growing a $Ta_2N$ sacrificial layer on the GaN insertion layer, and growing a semiconductor layer on the $Ta_2N$ sacrificial layer to form a GaN wafer;
    bonding the GaN wafer with a first surface of a temporary carrier, and removing the $Nb_2N$ sacrificial layer and the $Ta_2N$ sacrificial layer; and
    transferring remaining material after removal of the $Nb_2N$ sacrificial layer and the $Ta_2N$ sacrificial layer to a target substrate, and removing the temporary carrier from the remaining material to form the GaN chip.

2. The method according to claim 1, wherein growing the $Nb_2N$ sacrificial layer on the original substrate comprises:
    fabricating the $Nb_2N$ sacrificial layer with a thickness of 0-50 nm on the original substrate.

3. The method according to claim 1, wherein growing the $Ta_2N$ sacrificial layer on the GaN insertion layer comprises:
    fabricating the $Ta_2N$ sacrificial layer with a thickness of 0-50 nm on the GaN insertion layer.

4. The method according to claim 1, wherein bonding the GaN wafer with the first surface of the temporary carrier comprises:
    coating the first surface of the temporary carrier with an adhesive material, placing the temporary carrier on a hot plate for baking, and then cooling the temporary carrier.

5. The method according to claim 4, wherein coating the first surface of the temporary carrier with the adhesive material comprises:
    coating the first surface of the temporary carrier with the adhesive material by a spin coating method, and controlling a rotation speed to be 1200-3000 rpm and a time to be 30-60 seconds.

6. The method according to claim 4, wherein placing the temporary carrier on the hot plate for baking comprises:
    controlling the temperature of the hot plate to 120° C. and baking for 3 minutes; and
    controlling the temperature of the hot plate to 180° C. and baking for 4 minutes.

7. The method according to claim 1, wherein bonding the GaN wafer with the first surface of the temporary carrier comprises:
    controlling a bonding temperature to 200-350° C. and a bonding force to 1000-2000 N.

8. The method according to claim 1, wherein removing the $Nb_2N$ sacrificial layer and the $Ta_2N$ sacrificial layer comprises:
    removing the $Nb_2N$ sacrificial layer and the $Ta_2N$ sacrificial layer by etching with hydrochloric acid and hydrofluoric acid at a volume ratio of 1:1.

9. The method according to claim 1, wherein transferring the remaining material after removal of the $Nb_2N$ sacrificial layer and the $Ta_2N$ sacrificial layer to the target substrate comprises:
    activating the remaining material and the target substrate with nitrogen or oxygen, aligning the activated target substrate with the activated remaining material for attachment, and carrying out annealing.

10. A chip, fabricated by the method according to claim 1.

11. The method according to claim 1, wherein the material of the original substrate is one of SiC, GaN, sapphire, diamond, $Ga_2O_3$ and AlN.

12. The method according to claim 1, wherein in the step of growing the $Ta_2N$ sacrificial layer on the GaN insertion layer, the $Ta_2N$ sacrificial layer with hexagonal crystal structure symmetry is grown on the GaN insertion layer by thin film deposition.

13. The method according to claim 1, wherein in the step of bonding the GaN wafer with the first surface of the temporary carrier, the wafer bonding is carried out through a wafer bonding machine, a bonding temperature is 150-200° C., a bonding time is 5-10 min, and a pressure is 0.1 MPa.

14. The method according to claim 8, wherein in the step of removing the $Nb_2N$ sacrificial layer and the $Ta_2N$ sacrificial layer, the $Nb_2N$ sacrificial layer and the $Ta_2N$ sacrificial layer are removed by a selective wet chemical etching, the original substrate is separated from the GaN insertion layer after etching.

15. The chip according to claim 10, wherein growing the $Nb_2N$ sacrificial layer on the original substrate comprises:
    fabricating a $Nb_2N$ sacrificial layer with a thickness of 0-50 nm on the original substrate.

16. The chip according to claim 10, wherein growing the $Ta_2N$ sacrificial layer on the GaN insertion layer comprises:
    fabricating the $Ta_2N$ sacrificial layer with a thickness of 0-50 nm on the GaN insertion layer.

17. The chip according to claim 10, wherein bonding the GaN wafer with the first surface of the temporary carrier comprises:

coating the first surface of the temporary carrier with an adhesive material, placing the temporary carrier on a hot plate for baking, and then cooling the temporary carrier.

18. The chip according to claim 17, wherein coating the first surface of the temporary carrier with the adhesive material comprises:

coating the first surface of the temporary carrier with the adhesive material by a spin coating method, and controlling a rotation speed to be 1200-3000 rpm and a time to be 30-60 seconds.

19. The chip according to claim 17, wherein placing the temporary carrier on the hot plate for baking comprises:

controlling the temperature of the hot plate to 120° C. and baking for 3 minutes; and controlling the temperature of the hot plate to 180° C. and baking for 4 minutes.

20. The chip according to claim 10, wherein bonding the GaN wafer with the first surface of the temporary carrier comprises:

controlling a bonding temperature to 200-350° C. and a bonding force to 1000-2000 N.

* * * * *